(12) United States Patent
Akiyama

(10) Patent No.: US 10,389,083 B2
(45) Date of Patent: Aug. 20, 2019

(54) MODULATED LIGHT SOURCE

(71) Applicants: FUJITSU LIMITED, Kawasaki-shi, Kanagawa (JP); Photonics Electronics Technology Research Association, Tokyo (JP)

(72) Inventor: Tomoyuki Akiyama, Yokohama (JP)

(73) Assignees: FUJITSU LIMITED, Kawasaki (JP); PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 0 days.

(21) Appl. No.: 16/138,304

(22) Filed: Sep. 21, 2018

(65) Prior Publication Data

US 2019/0097383 A1    Mar. 28, 2019

(30) Foreign Application Priority Data

Sep. 26, 2017    (JP) ................................ 2017-184396

(51) Int. Cl.
| | | |
|---|---|---|
| *H01S 5/50* | (2006.01) | |
| *H01S 5/00* | (2006.01) | |
| *G02B 6/122* | (2006.01) | |
| *G02B 27/09* | (2006.01) | |
| *H01S 3/08* | (2006.01) | |

(52) U.S. Cl.
CPC ............ *H01S 5/0085* (2013.01); *G02B 6/122* (2013.01); *G02B 27/0977* (2013.01); *H01S 3/08027* (2013.01); *H01S 5/50* (2013.01)

(58) Field of Classification Search
CPC .......... H01S 5/0085; H01S 5/50; H01S 3/083; H01S 3/08027
See application file for complete search history.

(56) References Cited

U.S. PATENT DOCUMENTS

2016/0156149 A1    6/2016    Takabayashi et al.
2016/0218481 A1*   7/2016    Akiyama ................ G02F 1/225

FOREIGN PATENT DOCUMENTS

| JP | 2016-102926 A | 6/2016 |
| JP | 2016-139741 A | 8/2016 |

\* cited by examiner

*Primary Examiner* — Michael Carter
(74) *Attorney, Agent, or Firm* — Westerman, Hattori, Daniels & Adrian, LLP

(57) ABSTRACT

A modulated light source includes a reflective semiconductor optical amplifier including a mirror at a first end of the reflective semiconductor optical amplifier, a modulator configured to modulate a central wavelength, a first mirror configured to reflect light transmitted by the modulator, an optical filter disposed between a second end of the reflective semiconductor optical amplifier and the modulator, and a second mirror configured to reflect part of incoming light and to transmit the other part of the incoming light. The reflective semiconductor optical amplifier, the optical filter, and the second mirror configure a Fabry-Perot laser. The first mirror is configured to feed light emitted from the Fabry-Perot laser back to the Fabry-Perot laser, and the modulated light source is configured to select light corresponding to one of longitudinal modes oscillated by the Fabry-Perot laser, to modulate the selected light, and to output the modulated light.

11 Claims, 8 Drawing Sheets

MODULATED LIGHT SOURCE

CROSS-REFERENCE TO RELATED APPLICATION

This application is based on and claims priority to Japanese Patent Application No. 2017-184396, filed on Sep. 26, 2017, the entire contents of which are incorporated herein by reference.

FIELD

The embodiments discussed herein relate to a modulated light source.

BACKGROUND

Performance of a large-scale multi-chip package system is highly dependent on communication capacity between integrated circuits, or communication capacity between packages on which the integrated circuits are installed. To attain a communication capacity of 10 to 100 Tb/s, a small-scale optical transceiver of low power consumption is required. As a modulated light source for modulating light is used in such a type of optical transceiver, the modulated light source is also required to be small in size and to be of low power consumption. As this type of modulated light source, a modulated light source formed of a semiconductor laser and a ring modulator is disclosed (see Patent Document 1, for example).

However, noise may occur in a modulated light source as disclosed in Patent Document 1, because the modulated light source may oscillate at multiple wavelengths, or an oscillating wavelength may be switched among multiple wavelengths. Such occurrence of noise in a modulated light source is not preferable because the noise may degrade communication performance.

The following is reference documents:
[Patent Document 1] Japanese Laid-Open Patent Publication No. 2016-139741,
[Patent Document 2] Japanese Laid-Open Patent Publication No. 2016-102926.

SUMMARY

In one aspect, a modulated light source includes a reflective semiconductor optical amplifier including a mirror at a first end of the reflective semiconductor optical amplifier, a modulator configured to modulate a central wavelength, a first mirror configured to reflect light transmitted by the modulator, an optical filter disposed between a second end of the reflective semiconductor optical amplifier and the modulator, and a second mirror configured to reflect part of incoming light and to transmit another part of the incoming light. The reflective semiconductor optical amplifier, the optical filter, and the second mirror configure a Fabry-Perot laser. The first mirror is configured to feed light emitted from the Fabry-Perot laser back to the Fabry-Perot laser, and the modulated light source is configured to selectively modulate light corresponding to one of longitudinal modes oscillated by the Fabry-Perot laser, and to output the modulated light.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENT

Figure 1:
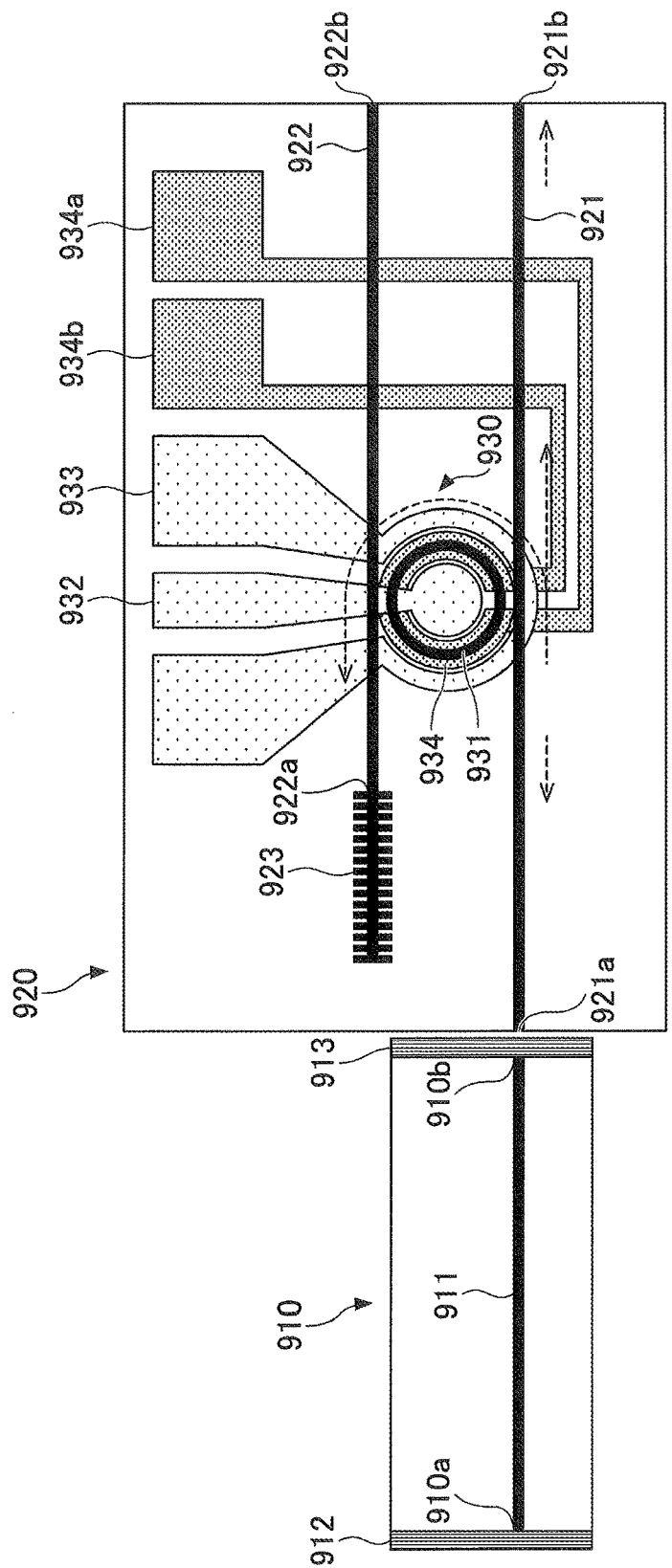
FIG. 1 is a diagram illustrating a structure of a modulated light source.

Hereinafter, embodiments of the present disclosure will be described. In the following description, elements having substantially identical features are given the same reference symbols and overlapping descriptions may be omitted.

First Embodiment

First, a reason that noise occurs in a modulated light source illustrated in FIG. 1 will be explained. The modulated light source illustrated in FIG. 1 includes an FP (Fabry-Perot) laser 910 and an optical integrated circuit 920.

The FP laser 910 is a laser that oscillates in FP (Fabry-Perot) modes having a predetermined wavelength interval, and is formed of semiconductor material such as InGaAsP.

The FP laser 910 includes an optical waveguide 911, a reflective film 912 disposed at one end 910a which serves as a mirror, and a reflective film 913 disposed at the other end 910b. The reflective film 912 reflects light at a high reflectance. The reflective film 913 has a lower reflectance than the reflective film 912, and is a mirror that transmits part of incident light.

The optical integrated circuit 920 is formed by processing an SOI (Silicon on Insulator) substrate or the like. The optical integrated circuit 920 includes a ring modulator 930. The ring modulator 930 includes a ring resonator 931, modulation electrodes 932 and 933, a heater 934, and the like. The ring resonator 931 is formed of a ring-shaped optical waveguide. The modulation electrode 932 is disposed inside the ring resonator 931, and the modulation electrode 933 is disposed at outside of the ring resonator 931. Because a resonant wavelength of the ring resonator 931 can be changed by applying voltage between the modulation electrodes 932 and 933, the ring modulator 930 can perform optical modulation.

The heater 934 acts as a wavelength adjusting electrode. The heater 934 is disposed along an inner circumference and an outer circumference of the ring resonator 931, corresponding to a shape of the ring resonator 931, so as to heat the ring resonator 931 locally. A heater electrode 934a is provided at one end of the heater 934, and a heater electrode 934b is provided at the other end of the heater 934. By flowing current between the heater electrode 934a and the heater electrode 934b, a portion of the ring modulator 930 where the ring resonator 931 is formed can be heated. Accordingly, because a temperature of the ring resonator 931 can be changed, the resonant wavelength of the ring resonator 931 can be adjusted.

Further, the ring resonator 931 is disposed between a first optical waveguide 921 and a second optical waveguide 922. In other words, the first optical waveguide 921 and the second optical waveguide 922 are provided in a vicinity of the ring resonator 931, so as to face each other via the ring resonator 931. At one end 921a of the first optical waveguide 921, light emitted from the end 910b of the FP laser 910 is entered. From the other end 921b of the first optical waveguide 921, light modulated by the ring modulator 930 (which may be referred to as "modulated output light") is emitted. At one end 922a of the second optical waveguide 922, a DBR (Distributed Bragg Reflector) mirror 923 formed of a diffraction grating is provided. From the other end 922b of the second optical waveguide 922, modulated output light is emitted. Note that the first optical waveguide 921, the second optical waveguide 922, and the ring resonator 931 are formed of silicon.

The first optical waveguide 921 approaches the ring resonator 931 closest at a region between the end 921a and the end 921b. The second optical waveguide 922 approaches the ring resonator 931 closest at a region between the end 922a and the end 922b.

Figure 2:
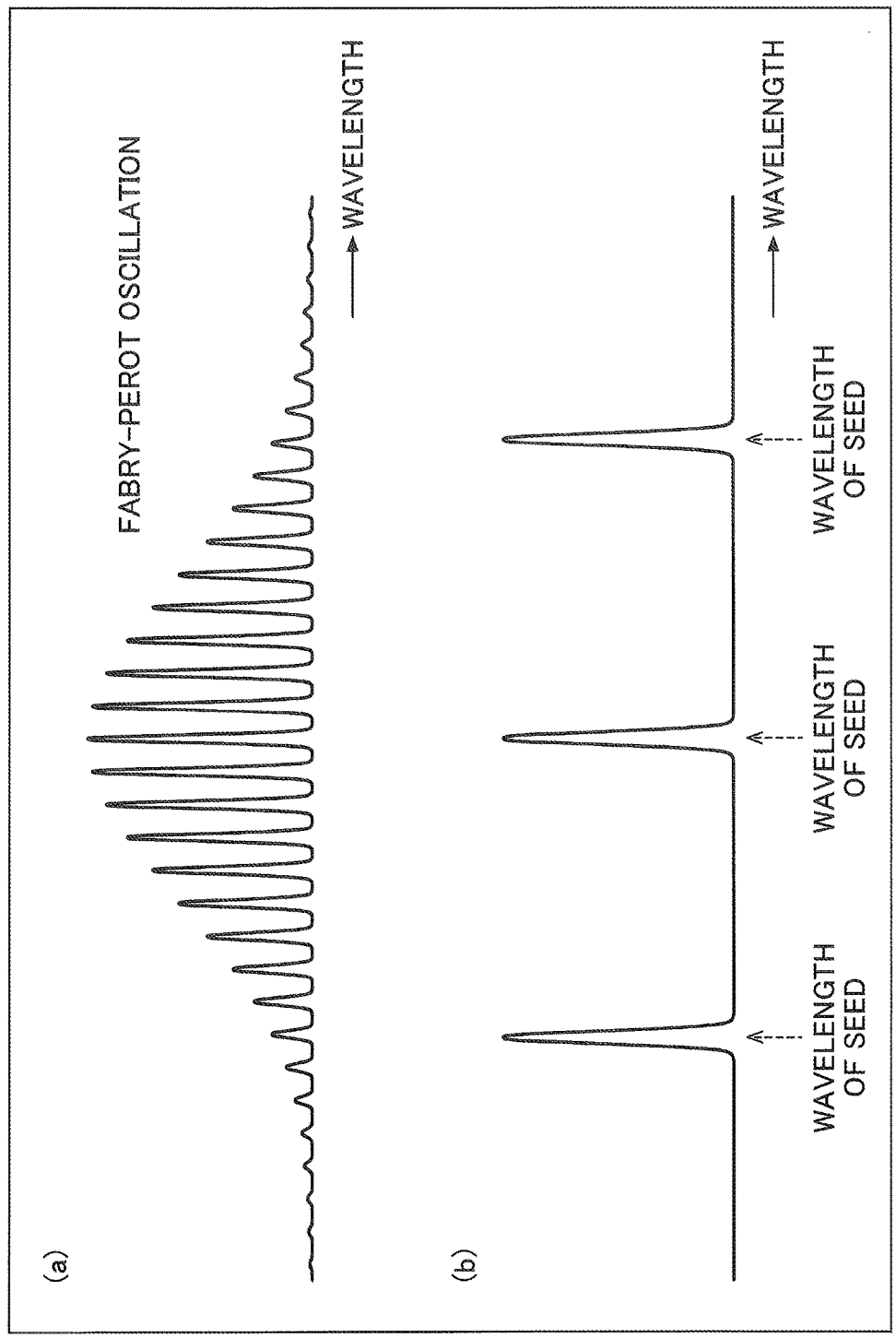
FIG. 2 illustrates an example of operation of the modulated light source.

As illustrated in a chart (a) in FIG. 2, the modulated light source illustrated in FIG. 1 oscillates in FP modes in which multiple longitudinal modes appear, by actuating the FP laser 910. This oscillation is referred to as FP (Fabry-Perot) oscillation. In FP oscillation, a wavelength interval between adjacent peaks is 1 nm, for example.

Part of laser light oscillated by the FP laser 910 in FP modes is output from the end 910b by being transmitted through a reflective film 913, and is input to the end 921a of the first optical waveguide 921 in the optical integrated circuit 920. The light input to the first optical waveguide 921 is propagated toward the other end 921b of the first optical waveguide 921. At a region of the first optical waveguide 921 approaching the ring resonator 931, light of the same wavelength as the resonant wavelength of the ring resonator 931 is propagated to the ring resonator 931. The light propagated to the ring resonator 931 is then propagated to the second optical waveguide 922 from a region of the ring resonator 931 approaching the second optical waveguide 922, and is reflected by the DBR mirror 923 provided at the end 922a of the second optical waveguide 922. When the light is reflected by the DBR mirror 923, the light is propagated through an opposite route of the light before the light has been propagated. Accordingly, the DBR mirror 923 feeds only the light, which has passed through the ring modulator 930 and has reached the DBR mirror 923, back to the FP laser 910 as seed light for stimulated emission. As illustrated in a chart (b) in FIG. 2, multiple seed light of different wavelengths corresponding to the resonant wavelength of the ring resonator 931 is generated. An interval of each wavelength of the seed light is approximately 19 nm, for example.

The modulated light source illustrated in FIG. 1 strengthens, among Fabry-Perot modes, oscillation of modes in which corresponding seed light exists. However, as illustrated in FIG. 2, in a case in which multiple wavelengths of seed light are included in a Fabry-Perot oscillation wavelength region, it is difficult to feedback light of only a specific wavelength in the Fabry-Perot oscillation wavelength region. Thus, multiple wavelengths of seed light are fed back. As a result, noise may occur in the modulated light source because oscillation occurs at multiple wavelengths or because an oscillating wavelength may switch among multiple wavelengths. Such occurrence of noise is not preferable because it leads to a quality degradation of modulated output light or the like.

<Modulated Light Source>

Figure 3:
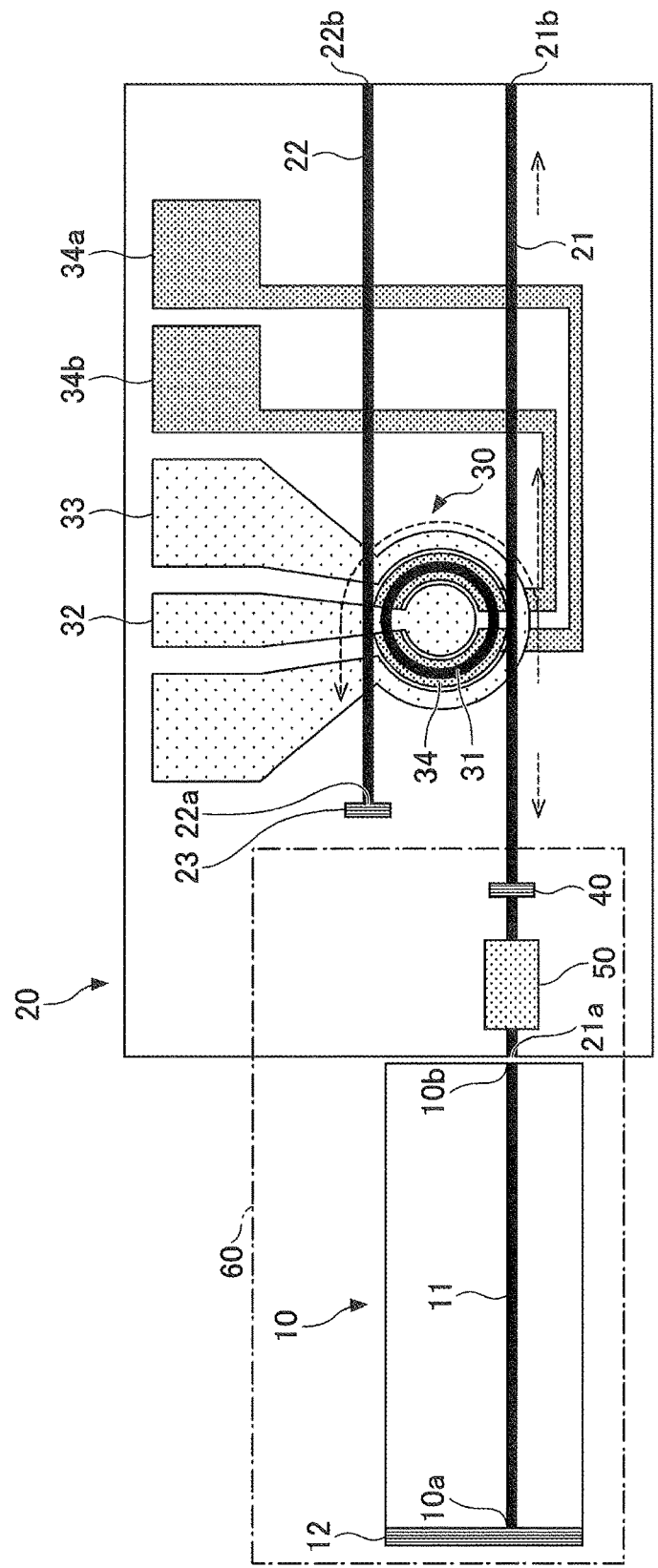
FIG. 3 is a diagram illustrating a structure of a modulated light source according to a first embodiment.

Next, a modulated light source according to a first embodiment will be described. As illustrated in FIG. 3, the modulated light source according to the first embodiment includes a reflective SOA (Semiconductor Optical Amplifier) 10, and an optical integrated circuit 20.

The reflective SOA 10 is formed of compound semiconductor material. The reflective SOA 10 includes an optical gain waveguide 11 and a mirror 12. The mirror 12 is provided at one end 10a (may also be referred to as a "first end 10a") of the reflective SOA 10. However, a mirror is not provided at the other end 10b (may also be referred to as a "second end 10b") of the reflective SOA 10. Note that, in the present disclosure, the optical gain waveguide 11 may also be referred to as an "optical waveguide in the reflective SOA 10".

In the present embodiment, the reflective SOA 10 is formed on an InP substrate. The optical gain waveguide 11 is formed of an active layer of InGaAsP. The optical gain waveguide 11 may also be formed of compound semiconductor material such as GaAs, GaN, or another type of compound semiconductor material formed by mixing GaAs or GaN with In, P, or the like. Further, the optical gain waveguide 11 may be formed of a microstructure such as a quantum well or quantum dots.

The optical integrated circuit 20 is formed by processing an SOI substrate or the like. The optical integrated circuit 20 includes a mirror 23, a ring modulator 30, a mirror 40, an optical filter 50, and the like. Note that, in the present disclosure, the mirror 23 may be referred to as a first mirror and the mirror 40 may be referred to as a second mirror.

The ring modulator 30 includes a ring resonator 31, modulation electrodes 32 and 33, a heater 34, and the like. The ring resonator 31 is formed of a ring-shaped optical waveguide having a radius of approximately 5 μm. The modulation electrode 32 is provided inside the ring resonator 31, and the modulation electrode 33 is provided at outside of the ring resonator 31. By applying voltage between the modulation electrodes 32 and 33, a resonant wavelength of the ring resonator 31 can be changed. Accordingly, in the ring modulator 30, a central wavelength is modulated by changing voltage applied between the modulation electrodes 32 and 33, and thereby output light which is output from an output port can be intensity modulated.

In the present embodiment, an output port is an end 21b (may also be referred to as a "second end 21b") of a first optical waveguide 21, or an end 22b (may also be referred to as a "second end 22b") of a second optical waveguide 22. In the ring-shaped optical waveguide forming the ring resonator 31, a p-type doped region and an n-type doped region are formed. By applying a reverse bias voltage or a forward bias voltage between the p-type doped region and the n-type doped region through the modulation electrodes 32 and 33, a refractive index of the ring resonator 31 is changed, and thereby a resonant wavelength can be modulated.

The heater 34 acts as a wavelength adjusting electrode. The heater 34 is disposed along an inner circumference and an outer circumference of the ring resonator 31, corresponding to a shape of the ring resonator 31, so as to heat the ring resonator 31 locally. A heater electrode 34a is provided at one end of the heater 34, and a heater electrode 34b is provided at the other end of the heater 34. By flowing current between the heater electrode 34a and the heater electrode 34b, a portion of the ring modulator 30 where the ring resonator 31 is formed can be heated. Accordingly, by changing a temperature of the ring resonator 31, a resonant wavelength of the ring resonator 31 can be adjusted.

Further, the ring resonator 31 is disposed between the first optical waveguide 21 and the second optical waveguide 22. In other words, the first optical waveguide 21 and the second optical waveguide 22 are provided in a vicinity of the ring resonator 31, so as to face each other via the ring resonator 31. At an end 21a (may also be referred to as a "first end 21a") of the first optical waveguide 21, light emitted from the second end 10b of the reflective SOA 10 is entered. From the second end 21b of the first optical waveguide 21, light modulated by the ring modulator 30 (which may be referred to as "modulated output light") is emitted. To an end 22a (may also be referred to as a "first end 22a") of the second optical waveguide 22, the mirror 23 for reflecting incoming light at a high reflectance is provided. From the second end 22b of the second optical waveguide 22, modulated output light is emitted. Note that the first optical waveguide 21, the second optical waveguide 22, and the ring resonator 31 are formed of silicon.

The optical filter 50 and the mirror 40 are disposed on the first optical waveguide 21, in an order of the optical filter 50 and the mirror 40, from the first end 21a toward the second end 21b. The first optical waveguide approaches the ring resonator 31 closest at a region between the mirror 40 and the second end 21b. The second optical waveguide 22 approaches the ring resonator 31 closest at a region between the first end 22a and the second end 22b. A reflectance of the mirror 40 is less than that of the mirror 12, and the mirror 40 transmits part of incoming light. The optical filter 50 transmits light of predetermined wavelengths, and transmits light in accordance with transmittance distribution as illustrated in a chart (a) of FIG. 4 having a half width (full width at half maximum) $\Delta\lambda f$. The half width $\Delta\lambda f$ of the transmittance distribution of the optical filter 50 is substantially the same as a wavelength interval of seed light which will be described below.

In the modulated light source according to the present embodiment, an FP laser 60 is formed by the reflective SOA 10, the optical filter 50 and the mirror 40 in the optical integrated circuit 20. Accordingly, when the reflective SOA 10 is operated, oscillation occurs between the mirror 12 and the mirror 40. However, as the optical filter 50 is disposed between the mirror 12 and the mirror 40, a range of Fabry-Perot oscillation is narrowly limited, as illustrated in a chart (b) in FIG. 4.

Part of laser light oscillated by the FP laser 60 in FP modes passes through the mirror 40, and is propagated in the first optical waveguide 21 of the optical integrated circuit 20 toward the second end 21b. At the region of the first optical waveguide 21 approaching the ring resonator 31, light of the same wavelength as the resonant wavelength of the ring resonator 31 is propagated to the ring resonator 31. The light propagated to the ring resonator 31 is then propagated to the second optical waveguide 22 from a region of the ring resonator 31 approaching the second optical waveguide 22, and is reflected by the mirror provided at the first end 22a of the second optical waveguide 22. The light reflected by the mirror 23 is propagated in a reverse direction. Accordingly, the mirror 23 feeds only the light, which has passed through the ring modulator 30 and has reached the mirror 23, back to the FP laser 60 as seed light for stimulated emission. As illustrated in a chart (c) in FIG. 4, multiple seed light of different wavelengths corresponding to the resonant wavelength of the ring resonator 31 is generated. An interval of each wavelength of the seed light is approximately 19 nm, for example.

As mentioned above, since the half width $\Delta\lambda f$ of the optical filter 50 is substantially the same as the wavelength interval of the seed light, one of the multiple seed light can be selectively amplified. The amplified light is output from the output port, which is the second end 21b of the first optical waveguide 21, or the second end 22b of the second optical waveguide 22.

Figure 4:
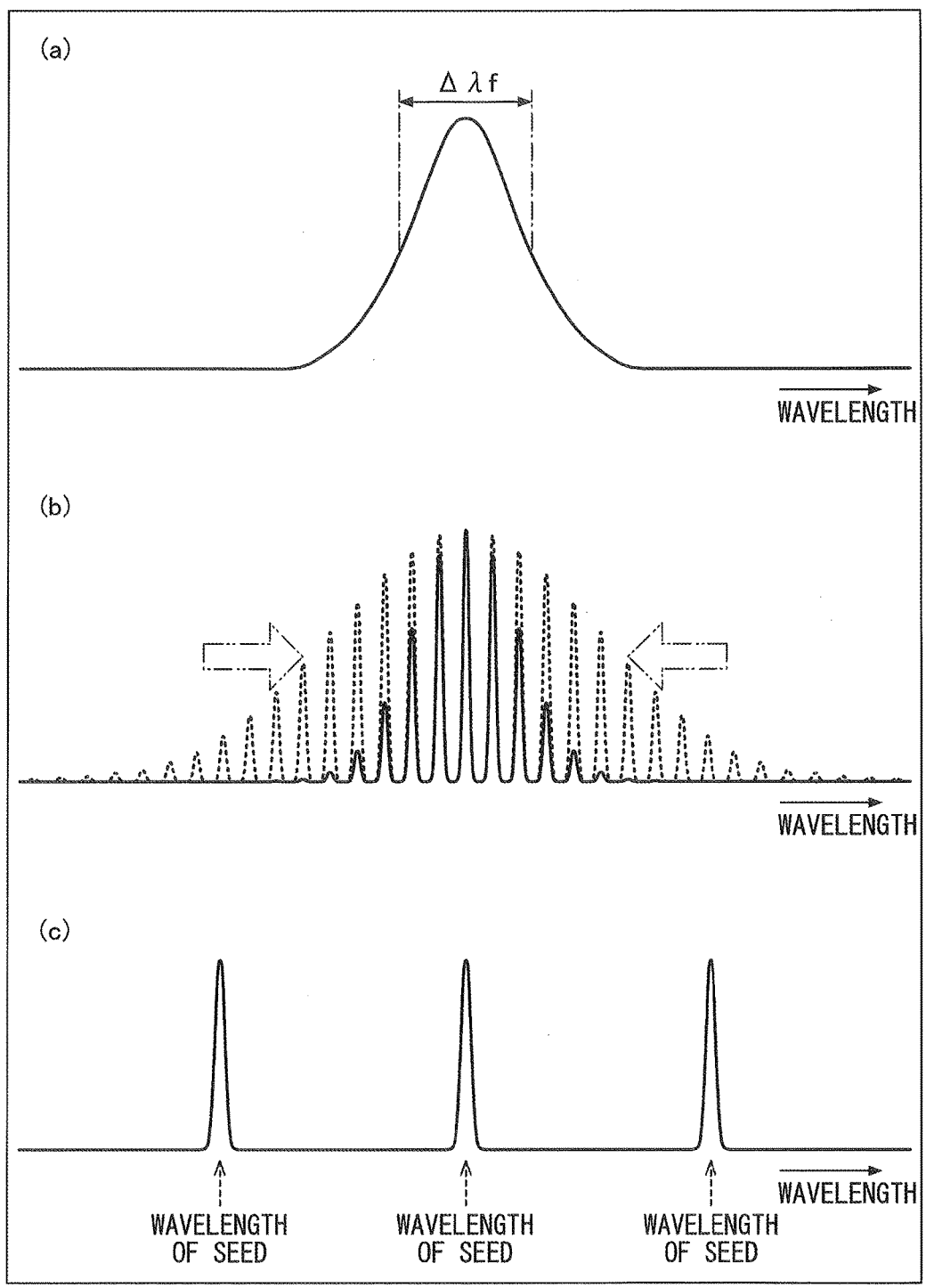
FIG. 4 illustrates an example of operation of the modulated light source according to the first embodiment.

In the modulated light source according to the present embodiment, as illustrated in FIG. 4, because only one seed light, among multiple seed light of multiple wavelengths, is within a Fabry-Perot oscillation wavelength region, only the one seed light can be fed back to the FP laser 60. Thus, because oscillation of multiple light of different wavelengths, or occurrence of switching of an oscillating wavelength, can be avoided, occurrence of noise can be suppressed and good modulated output light having less noise can be obtained. It is preferable that the half width $\Delta\lambda f$ of transmittance distribution in the optical filter 50 is substantially the same as the wavelength interval between multiple seed light. However, the half width $\Delta\lambda f$ can be larger than a wavelength interval between adjacent longitudinal modes of laser oscillated in FP modes, and can be less than twice a wavelength interval between adjacent seed light (the wavelength interval is equal to a wavelength interval between adjacent resonant wavelengths of the ring resonator 31). Even when the half width $\Delta\lambda f$ is within the above mentioned range, only light of a specific wavelength within a Fabry-Perot oscillation wavelength region can be fed back to the FP laser 60.

<Wavelength Control Mechanism>

Figure 5:
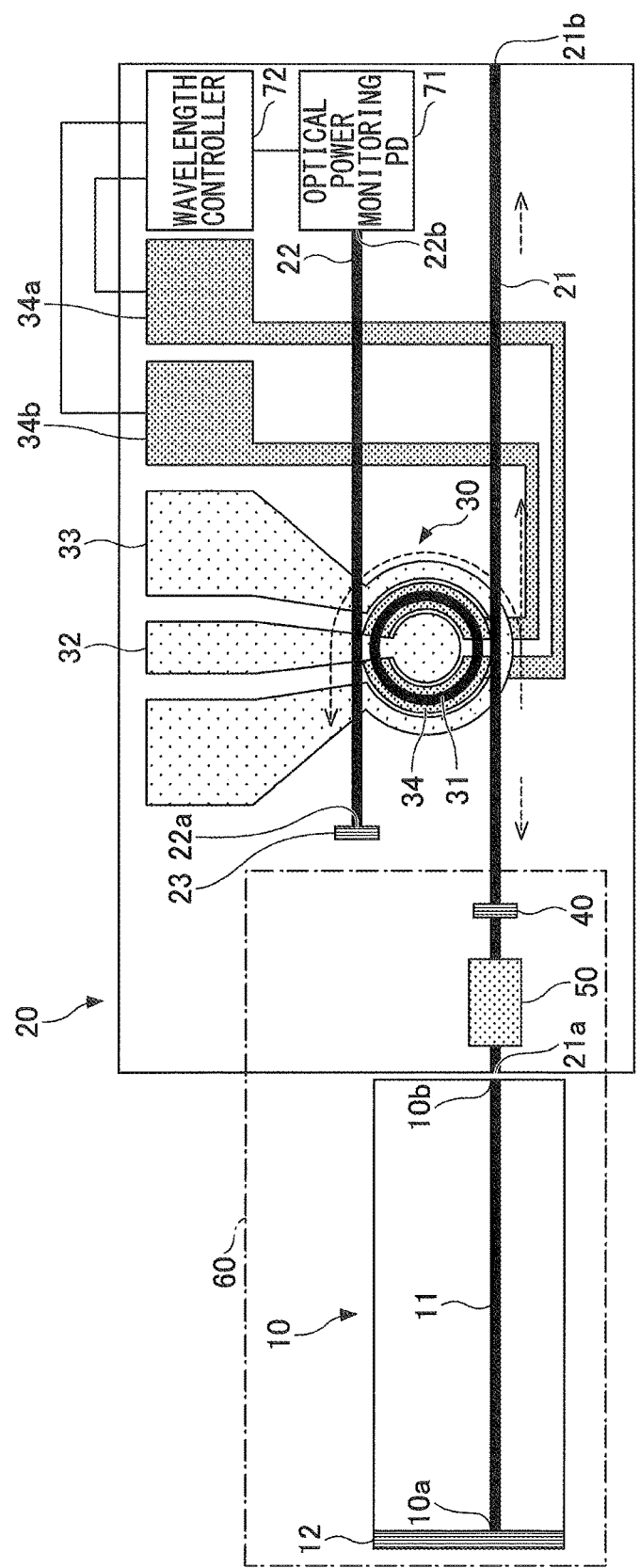
FIG. 5 is a diagram illustrating how the modulated light source according to the first embodiment is controlled by a heater.

In the present embodiment, as illustrated in FIG. 5, the modulated light source may include a wavelength control mechanism formed of an optical power monitoring photodetector (PD) 71 for detecting light emitted from the second end 22b of the second optical waveguide 22, a wavelength controller 72, and the like. The optical power monitoring photodetector 71 is formed of a photodiode or the like, and the wavelength controller 72 controls the ring modulator 30 such that a resonant wavelength of the ring modulator 30 becomes a predetermined wavelength, based on optical power detected by the optical power monitoring photodetector 71. Specifically, the wavelength controller 72 controls the wavelength by supplying electrical current to the heater 34 to heat the ring modulator 30 so as to be a predetermined temperature.

Second Embodiment

Figure 6:
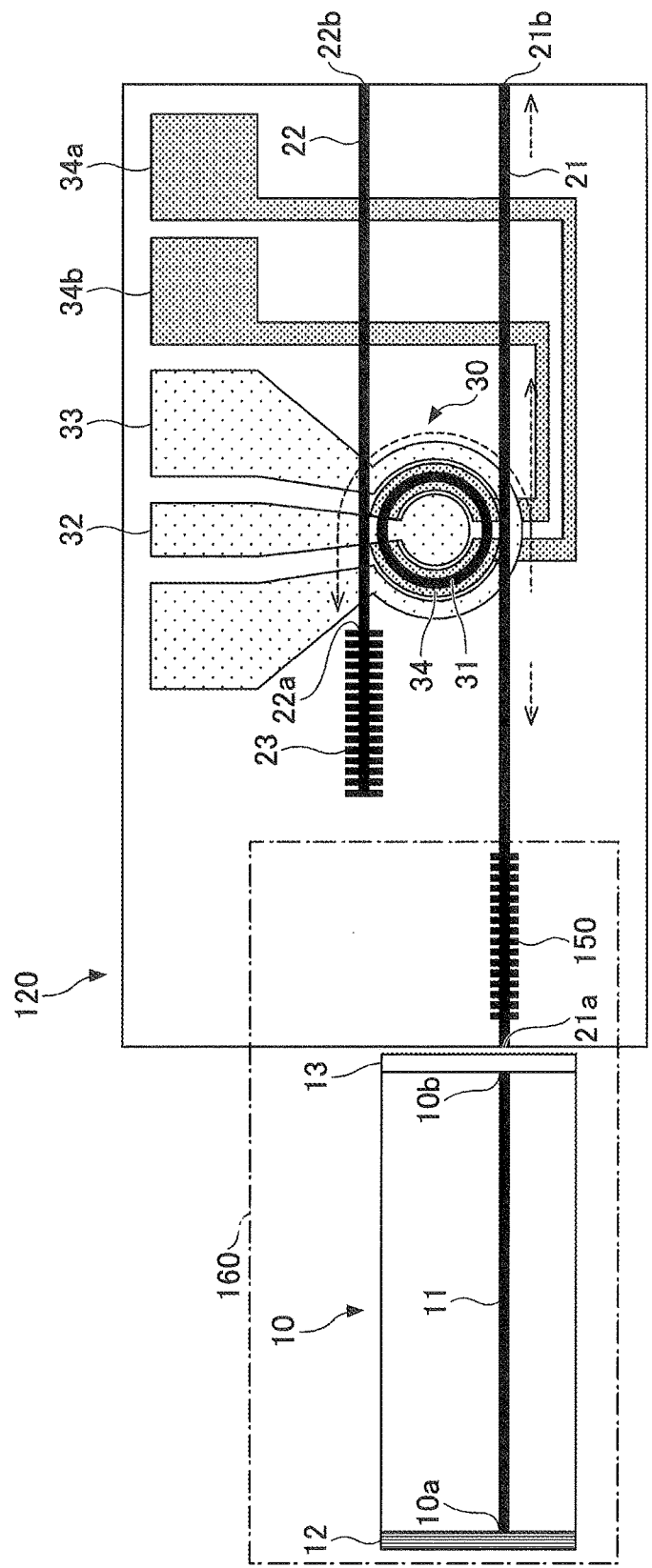
FIG. 6 is a diagram illustrating a structure of a modulated light source according to a second embodiment.

Next, a second embodiment will be described. A modulated light source according to the second embodiment employs a DBR mirror 150 having functions of the optical filter 50 and the mirror 40 in the first embodiment. As illustrated in FIG. 6, the modulated light source according to the second embodiment includes a reflective SOA 10 and an optical integrated circuit 120.

In the second embodiment, a mirror 12 provided at a first end 10a of the reflective SOA 10 is formed of a dielectric such as dielectric multilayer film. Further, at a second end 10b of the reflective SOA 10, antireflection film 13 formed of a dielectric or the like is provided.

With respect to the optical integrated circuit 120, the DBR mirror 150 is provided near a first end 21a of a first optical waveguide 21. The DBR mirror 150 is formed of a diffraction grating or the like, and has functions of the optical filter 50 and the mirror 40 in the first embodiment. Thus, the DBR mirror 150 can reflect light of a predetermined wavelength. A mirror 23 is also formed of a DBR mirror. With respect to preciseness of the DBR mirror 150, if the DBR mirror 150 is formed by processing a silicon layer of an SOI substrate, the preciseness of the DBR mirror 150 becomes higher than a DBR mirror formed on the reflective SOA 10 or the like.

In the modulated light source according to the present embodiment, an FP laser 160 is formed by the reflective SOA 10 and the DBR mirror 150 in the optical integrated circuit 20. Accordingly, when the reflective SOA 10 is operated, oscillation occurs between the mirror 12 and the DBR mirror 150. However, as the DBR mirror 150 has a predetermined reflection characteristic, a range of Fabry-Perot oscillation is narrowly limited, as illustrated in the chart (b) in FIG. 4.

Accordingly, in the modulated light source according to the present embodiment, among multiple seed light of multiple wavelengths, only one seed light is within a Fabry-Perot oscillation wavelength region, similar to the modulated light source according to the first embodiment. Thus, only the one seed light can be fed back to the FP laser 160. Therefore, because oscillation of multiple light of different wavelengths, or occurrence of switching of an oscillating wavelength, can be avoided, occurrence of noise can be suppressed and good modulated output light having less noise can be obtained.

Note that matters in the second embodiment other than what has been described above are similar to those in the first embodiment.

Third Embodiment

Figure 7:
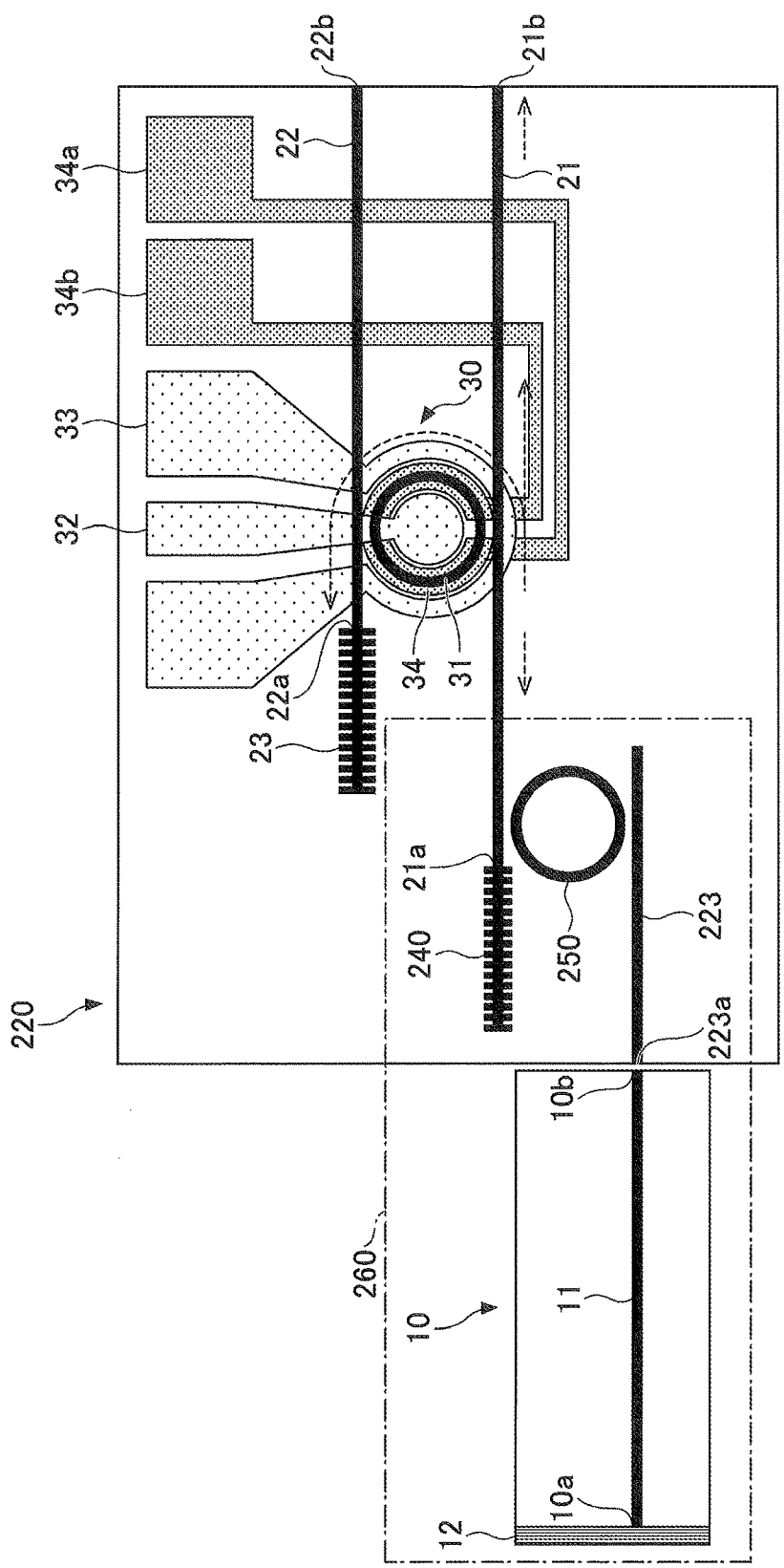
FIG. 7 is a diagram illustrating a structure of a modulated light source according to a third embodiment.

Next, a third embodiment will be described. As illustrated in FIG. 7, a modulated light source according to the third embodiment includes a reflective SOA 10 and an optical integrated circuit 220. In the modulated light source according to the third embodiment, a corresponding element of the optical filter 50 in the first embodiment is formed of a second ring resonator 250, and a corresponding element of the mirror 40 in the first embodiment is formed of a DBR mirror 240.

A third optical waveguide 223 is provided in the optical integrated circuit 220. Between the third optical waveguide 223 and a first optical waveguide 21, the second ring resonator 250 is disposed in proximity to the third optical waveguide 223 and the first optical waveguide 21. Also, the DBR mirror 240 is provided at a first end 21a of the first optical waveguide 21.

In the modulated light source according to the present embodiment, light emitted from a second end 10b of the reflective SOA 10 is input to a first end 223a of the third optical waveguide 223. Thus, an FP laser 260 is formed by the reflective SOA 10, the second ring resonator 250 in the optical integrated circuit 220, and the DBR mirror 240 in the optical integrated circuit 220.

Accordingly, when the reflective SOA 10 is operated, oscillation occurs between the mirror 12 and the DBR mirror 240. However, as the DBR mirror 240 has a predetermined transmission characteristic, a range of Fabry-Perot oscillation is narrowly limited, as illustrated in the chart (b) in FIG. 4.

Accordingly, in the modulated light source according to the present embodiment, among multiple seed light of multiple wavelengths, only one seed light is within a Fabry-Perot oscillation wavelength region, similar to the modulated light source according to the first embodiment. Thus, only the one seed light can be fed back to the reflective SOA 10. Therefore, because oscillation of multiple light of different wavelengths, or occurrence of switching of an oscillating wavelength, can be avoided, occurrence of noise can be suppressed and good modulated output light having less noise can be obtained.

Note that matters in the third embodiment other than what has been described above are similar to those in the first embodiment.

Fourth Embodiment

Figure 8:
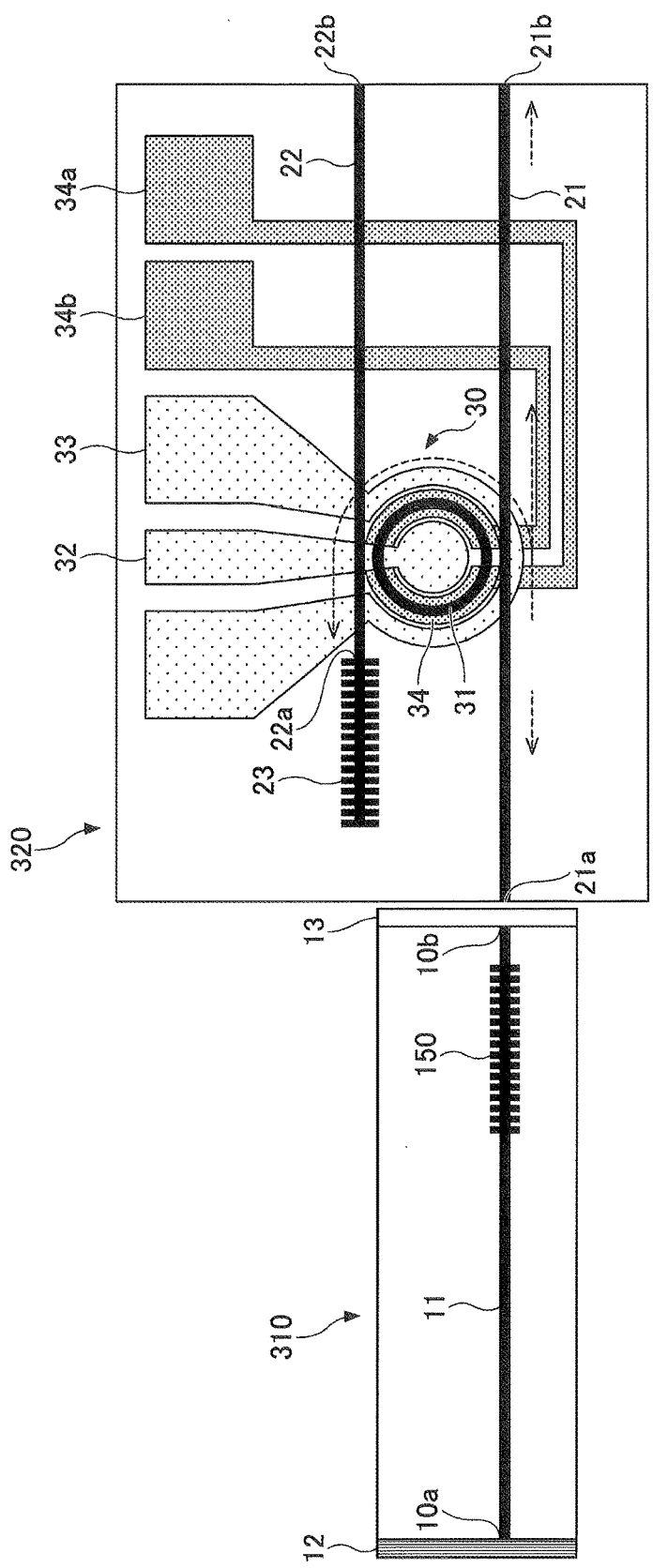
FIG. 8 is a diagram illustrating a structure of a modulated light source according to a fourth embodiment.

Next, a fourth embodiment will be described. In the modulated light source according to the second embodiment, the DBR mirror 150 is in the optical integrated circuit 120. However, in a modulated light source according to the fourth embodiment, the DBR mirror 150 is provided in a reflective SOA. As illustrated in FIG. 8, the modulated light source according to the fourth embodiment includes a DBR laser 310 and an optical integrated circuit 320. Specifically, the DBR laser 310 is configured by providing the DBR mirror 150 near a second end 10b on an optical gain waveguide 11 of the reflective SOA 10 in the second embodiment. Further, a configuration of the optical integrated circuit 320 is similar to that of the optical integrated circuit 120 in the second embodiment, except that the optical integrated circuit 320 does not include the DBR mirror 150.

In the modulated light source according to the present embodiment, when the DBR laser 310 is operated, oscillation occurs between the mirror 12 and the DBR mirror 150. However, as the DBR mirror 150 has a predetermined reflection characteristic, a range of Fabry-Perot oscillation is narrowly limited, as illustrated in the chart (b) in FIG. 4. Accordingly, in the modulated light source according to the present embodiment, among multiple seed light of multiple wavelengths, only one seed light is within a Fabry-Perot oscillation wavelength region, similar to the modulated light source according to the second embodiment. Thus, only the one seed light can be fed back. Therefore, because oscillation of multiple light of different wavelengths, or occurrence of switching of an oscillating wavelength, can be avoided, occurrence of noise can be suppressed and good modulated output light having less noise can be obtained.

Note that matters in the fourth embodiment other than what has been described above are similar to those in the first embodiment.

All examples and conditional language provided herein are intended for pedagogical purposes of aiding the reader in understanding the invention and the concepts contributed by the inventors to further the art, and are not to be construed as limitation to such specifically recited examples and conditions, nor does the organization of such examples in the specification relate to a showing of superiority and inferiority of the invention. Although one or more embodiments of the present invention have been described in detail, it should be understood that various changes, substitutions, and alterations could be made hereto without departing from the spirit and scope of the invention.

What is claimed is:
1. A modulated light source comprising:
 a reflective semiconductor optical amplifier including a mirror provided at a first end of the reflective semiconductor optical amplifier;
 a modulator configured to modulate a central wavelength;

a first mirror configured to reflect light transmitted by the modulator;
an optical filter disposed between a second end of the reflective semiconductor optical amplifier and the modulator; and
a second mirror configured to reflect part of incoming light and to transmit another part of the incoming light;
wherein a Fabry-Perot laser is configured by the reflective semiconductor optical amplifier, the optical filter, and the second mirror,
the first mirror is configured to feed light emitted from the Fabry-Perot laser back to the Fabry-Perot laser, and
the modulated light source is configured to selectively modulate light corresponding to one of longitudinal modes oscillated by the Fabry-Perot laser, and to output the modulated light.

2. The modulated light source according to claim 1, wherein the optical filter and the second mirror are integrally formed as a DBR mirror.

3. The modulated light source according to claim 1, wherein the modulator, the first mirror, the optical filter, and the second mirror are formed on a same substrate.

4. The modulated light source according to claim 1, wherein a half width of transmittance distribution of the optical filter is larger than a wavelength interval between the adjacent longitudinal modes, and is less than twice a wavelength interval between adjacent resonant wavelengths of a resonator included in the modulator.

5. The modulated light source according to claim 1, wherein the modulator is a ring modulator including a ring resonator, and the modulator includes a modulation electrode used for changing a resonant wavelength of the ring resonator.

6. The modulated light source according to claim 5, further including a first optical waveguide and a second optical waveguide disposed in proximity to the ring resonator, wherein
the first optical waveguide is configured such that light emitted from the reflective semiconductor optical amplifier is input from a first end of the first optical waveguide,
the first mirror is provided at a first end of the second optical waveguide, and
a second end of the second optical waveguide is an output port of the modulated light.

7. The modulated light source according to claim 5, further including a first optical waveguide and a second optical waveguide disposed in proximity to the ring resonator, wherein
the first optical waveguide is configured such that light emitted from the reflective semiconductor optical amplifier is input from a first end of the first optical waveguide, and that a second end of the first optical waveguide is an output port of the modulated light, and
the first mirror is provided at a first end of the second optical waveguide.

8. A modulated light source comprising:
a semiconductor laser including a mirror at a first end of the semiconductor laser and a DBR mirror at a second end of the semiconductor laser;
a modulator configured to modulate a central wavelength; and
a first mirror configured to reflect light transmitted by the modulator; wherein
the DBR mirror is configured to reflect part of incoming light and to transmit another part of the incoming light,
the first mirror is configured to feed light emitted from the semiconductor laser back to the semiconductor laser, and
the modulated light source is configured to selectively modulate light corresponding to one of longitudinal modes oscillated by the semiconductor laser, and to output the modulated light.

9. The modulated light source according to claim 8, wherein the modulator is a ring modulator including a ring resonator, and the modulator includes a modulation electrode used for changing a resonant wavelength of the ring resonator.

10. The modulated light source according to claim 9, further including a first optical waveguide and a second optical waveguide disposed in proximity to the ring resonator, wherein
the first optical waveguide is configured such that light emitted from the semiconductor laser is input from a first end of the first optical waveguide,
the first mirror is provided at a first end of the second optical waveguide, and
a second end of the second optical waveguide is an output port of the modulated light.

11. The modulated light source according to claim 9, further including a first optical waveguide and a second optical waveguide disposed in proximity to the ring resonator, wherein
the first optical waveguide is configured such that light emitted from the semiconductor laser is input from a first end of the first optical waveguide, and that a second end of the first optical waveguide is an output port of the modulated light, and
the first mirror is provided at a first end of the second optical waveguide.

* * * * *